United States Patent [19]

Jackson

[11] Patent Number: 4,899,155
[45] Date of Patent: Feb. 6, 1990

[54] APPARATUS AND METHOD FOR ANALOGUE TO DIGITAL CONVERSION

[75] Inventor: Thomas Jackson, Hanwell, England

[73] Assignee: Plessey Overseas Limited, Ilford, England

[21] Appl. No.: 914,842

[22] PCT Filed: Jan. 16, 1986

[86] PCT No.: PCT/GB86/00029
§ 371 Date: Nov. 14, 1986
§ 102(e) Date: Nov. 14, 1986

[87] PCT Pub. No.: WO86/04470
PCT Pub. Date: Jul. 31, 1986

[30] Foreign Application Priority Data

Jan. 16, 1985 [GB] United Kingdom ............... 8501034

[51] Int. Cl.$^4$ ............................................. H03M 1/12
[52] U.S. Cl. .................................... 341/200; 341/155
[58] Field of Search ............... 340/347 AD, 347 NT; 375/30, 26, 27, 28, 33; 341/144, 115, 139, 145, 155, 156, 200; 332/11 D

[56] References Cited

U.S. PATENT DOCUMENTS 2,927,962  3/1960  Cutler ................................ 375/30
4,301,446  11/1981  Petit ............................ 340/347 AD

OTHER PUBLICATIONS

Sep. 1988—"Linear IC Handbook", Plessey Semiconductors, pp. 103-110.

Primary Examiner—William M. Shoop, Jr.
Assistant Examiner—Brian K. Young
Attorney, Agent, or Firm—Fleit, Jacobson, Cohn, Price, Holman & Stern

[57] ABSTRACT

An interpolating converter for digitizing an analogue signal, the converter in which comprises combiner means for receiving an analogue signal, one step digital quantizer means for receiving an input signal dependent upon an output signal from the combiner means, means for identifying the quantization error of the digital quantizer means, and feedback means for affording a signal dependent upon the quantization error of the digital quantizer means to the combiner means.

6 Claims, 3 Drawing Sheets

FIG. I.

APPARATUS AND METHOD FOR ANALOGUE TO DIGITAL CONVERSION

The present invention relates to interpolating analogue to digital converters and a method for effecting analogue to digital conversion.

Known interpolating analogue to digital converters usually comprise a relatively coarse resolution analogue to digital (A/D) converter arranged in a feedback loop in combination with a digital to analogue (D/A) converter; the D/A converter having much finer resolution than the coarse A/D converter. The coarse A/D converter, typically 6 bits resolution, is sampled at a high sample rate, typically 10 MHz, with subsequent averaging of the output samples obtained from the course resolution A/D converter.

The quantised signal appearing at the output of the coarse A/D converter is an approximation of the analogue signal fed to it, the approximation being dependent upon the quantum jump or step size of the quantisation and the sample rate used in the quantisation process. At any point in time, the difference between the analogue input signal and the output sample from the coarse A/D converter is known as the quantisation error; generally termed Q.

The output from the coarse A/D converter is fed to the finer resolution D/A converter, the output of which is fed back and combined with the incoming analogue input signal to be digitised. However the D/A converter utilised also gives rise to errors; generally termed T, the resolution of the D/A converter.

Such interpolating A/D converters also include an analogue controller, usually in the form of a high gain amplifier of gain A, in the feed path to the coarse A/D converter.

The digital output of this type of interpolating A/D converter can be expressed as $$D_{OUT} = \frac{V_I A}{1+A} + \frac{Q}{1+A} + \frac{TA}{1+A}$$

where $D_{OUT}$ is the digital output signal
$V_I$ is the analogue input signal
Q is the quantisation error of the coarse resolution A/D converter
T is the error in resolution of the D/A converter and
A is the open loop gain of the analogue controller.

It can be seen from this expression that the term in the quantisation error Q is minimised by maximising the open loop gain A of the analogue controller. However, an increase in the open loop gain A does not improve the linearity of the converter, that is the relationship between the digital output and the analogue input, as the term in the resolution T of the D/A converter remains constant for all but small values of open loop gain A. Furthermore, by maximising the open loop gain A, it becomes extremely difficult to maintain loop stability in the converter. In practice, the resolution of such converters is limited by the value of the term in the quantisation error Q and in modern interpolating A/D converters is usually limited to about 14 bits.

It is an object of the present invention to provide apparatus and a method for analogue to digital conversion which enable greater resolution and linearity than that attainable with known converters.

According to the present invention there is provided an interpolating converter for digitising an analogue signal, the converter comprising combiner means for receiving an analogue signal, one step digital quantiser means for receiving an input signal dependent upon an output signal from the combiner means, means for identifying the quantisation error of the one step digital quantiser means, and feedback means for affording a signal dependent upon the quantisation error of the one step digital quantiser means to the combiner means.

Preferably the means for identifying the quantisation error of the one step digital quantiser means comprises further combiner means for receiving a signal dependent upon an output signal from the one step digital quantiser means and means for affording a signal dependent upon the input signal to the one step digital quantiser means to the further combiner means.

Advantageously, the one step digital quantiser means comprises a D-type flip flop.

According to another aspect of the present invention there is also provided a method of analogue to digital conversion, the method comprising affording an analogue signal to one step digital quantiser means, identifying the quantisation error of the one step digital quantiser means, and combining substractively a signal dependent upon the quantisation error of the one step digital quantiser means with the analogue signal.

Conveniently, the quantisation error of the one step digital quantiser means is identified by combining the analogue signal afforded to the one step digital quantiser means with the output signal from the one step digital quantiser means.

An embodiment of the present invention will now be described, by way of example, with reference to the accompanying drawings in which.

Figure 1:
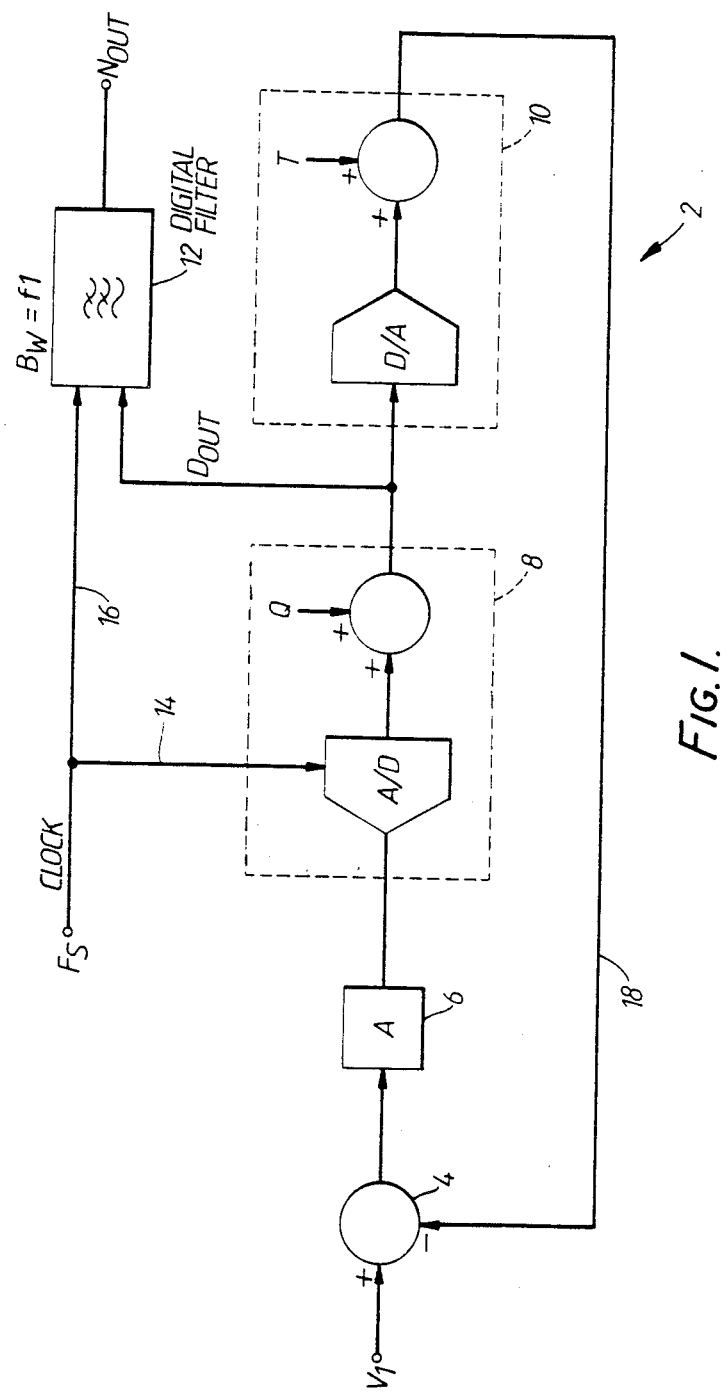
FIG. 1 illustrates a schematic block diagram of a known interpolating analogue to digital converter.

Referring to FIG. 1 a known type of interpolating A/D converter 2 comprises a combiner 4 such as a dual input operational amplifier. The output of the combiner 4 is connected via an analogue controller 6 to a coarse analogue to digital converter 8 having a quantisation error Q. The analogue controller 6 is chosen such that its gain is as high as possible whilst maintaining loop stability within the A/D converter 2. The output of the coarse A/D converter 8 is connected to a D/A converter 10 and a digital filter 12, the output of which is a digital output signal $N_{OUT}$ representing the amplitude of an analogue input signal $V_I$. The D/A converter 10 is chosen to have far greater resolution than the coarse A/D converter 8 and has errors due to resolution termed T. The resolution T in, for example, resistive ladder type D/A converters can arise from the tolerances of the resistors used in the various levels of the resistive ladder of the converter. A clock is provided (not shown) which provides clock pulses at a clock rate Fs to the coarse A/D converter 8 and the digital filter 12 along lines 14 and 16 respectively. The clock pulses synchronise the operation of the coarse A/D converter 8 and the digital filter 12.

The output of the D/A converter 10 is connected to the combiner 4 by a feedback loop 18 and the resolution of the D/A converter 2 is achieved by means of this feedback arrangement whereby the coarse output samples of the coarse A/D converter 8 are forced to interpolate at the high clock rate Fs. However, as described previously, the ultimate resolution of the A/D converter 2 is proportioned to Q/A and in practice is usually less than 14 bits.

Figure 2:
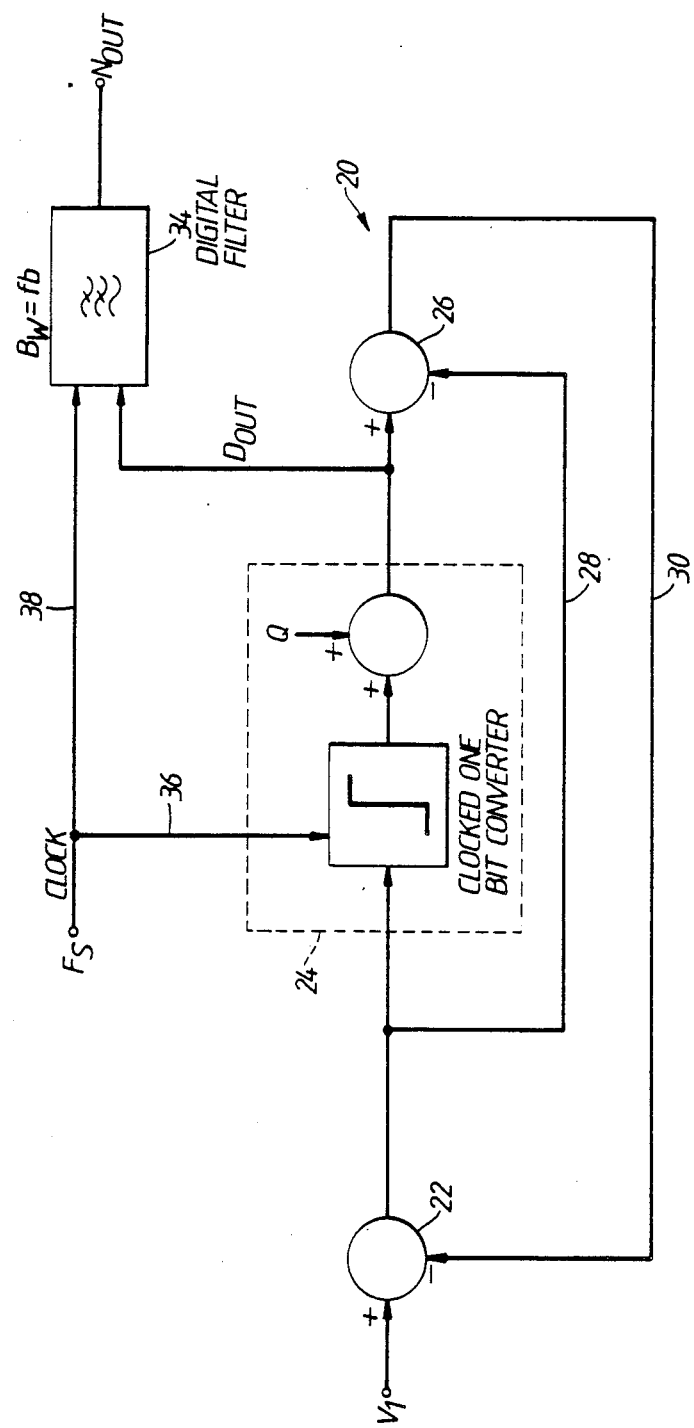
FIG. 2 illustrates a schematic block diagram of an interpolating analogue to digital converter in accordance with an aspect of the present invention.
Figure 3:
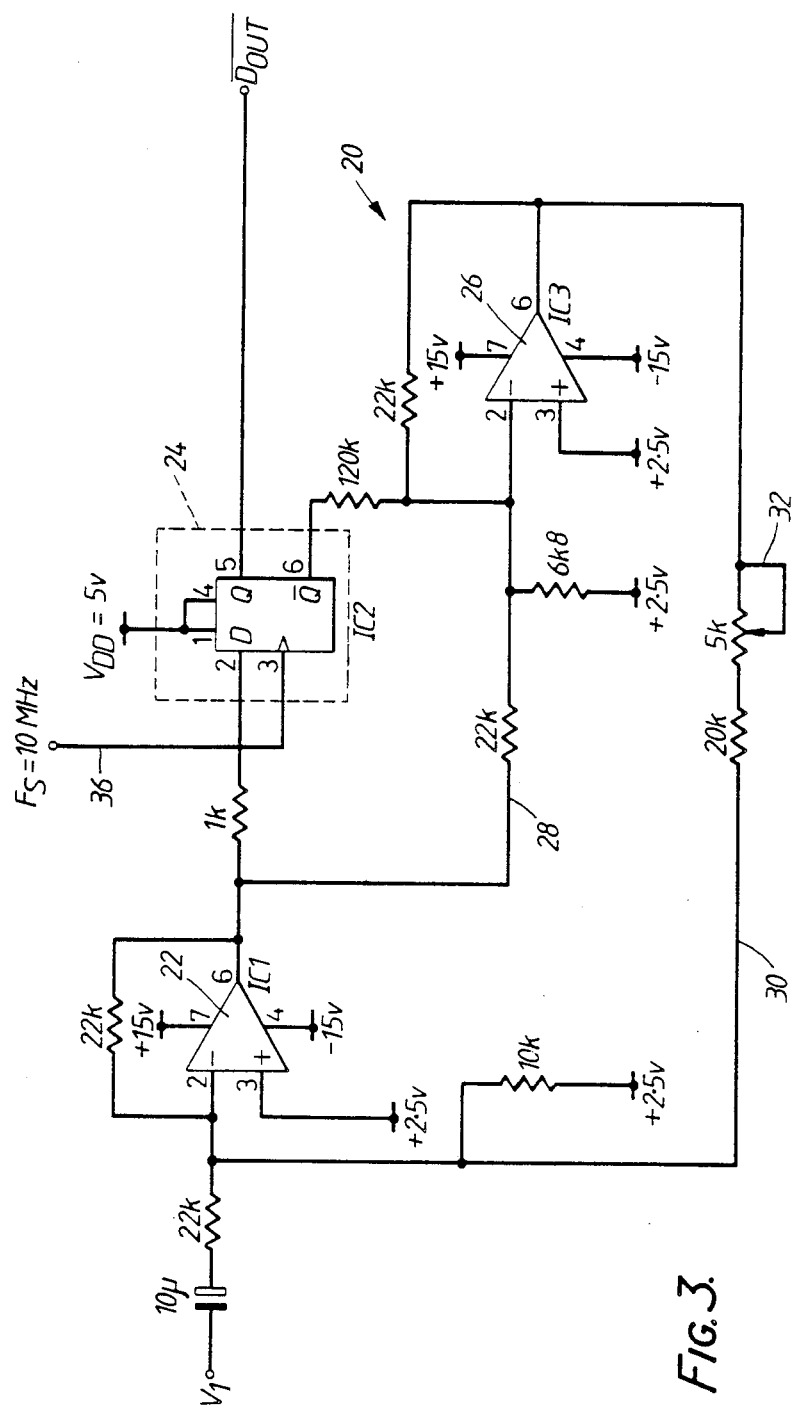
FIG. 3 illustrates a schematic circuit diagram of the interpolating analogue to digital converter shown in FIG. 2.

Referring now to FIGS. 2 and 3 there is shown an interpolating A/D converter 20 in accordance with the present invention. In FIGS. 2 and 3 like reference numerals have been used to indicate like parts of the A/D converter 20. The A/D converter 20 comprises combiner means in the form of a combiner 22, such as an operational amplifier as shown in FIG. 3, for receiving an analogue signal $V_I$. The output of the combiner 22 is connected to one step digital quantiser means in the form of a one bit converter 24, such as a D-type flip flop as shown in FIG. 3. The output of the one bit converter 24 is connected to an input of further combiner means in the form of a combiner 26, such as an operational amplifier similar to that utilised for the combiner 22. Feed forward means, such as a feed forward loop 28 is provided to afford the input to the one bit converter 24 to a second input of the combiner 26. The output of the combiner 26 is connected via feedback means in the form of a feedback loop 30 to a further input of the combiner 22. In operation the one bit converter 24 generates quantisation errors Q as it has only a single quantisation step, that is, its output is either at zero or maximum depending upon whether the amplitude of its input signal is above or below a mean threshold value. The combination of the combiner 26 and the feed forward loop 28 provides means for identifying the quantisation errors Q of the one bit converter 24, as described subsequently.

It can be seen from FIG. 3 that the feedback loop 30 includes trimmer means such as a potentiometer 32 for trimming the signal fed along the feedback loop 30 to the combiner 22. The output of the converter 24, is also connected to digital filter means, such as a digital filter 34 having a bandwidth $F_b$. A clock (not shown) is also provided for supplying clock pulses at a rate Fs, such as 10 MHz, to the converter 24 and the digital filter 34 along lines 36 and 38 respectively. The digital filter 34 may be a finite response filter or an infinite impulse response filter, depending upon operational requirements of the A/D converter 20.

In operation, an analogue signal to be digitised, $V_I$ is fed via the combiner 22 to the converter 24. The converter 24, being a one step or one bit converter produces a digital output signal which is the desired analogue input signal in combination with the quantisation error Q associated with the conversion. However, if the converter 24 is presented with a signal which consists of the analogue input signal plus the expected quantisation error inverted, then the digital output signal, Do, of the converter 24 will consist of a digital representation the analogue input signal.

The expected quantisation error Q of the converter 24 can be identified by substracting the input signal to the converter 24 from its output signal. In the A/D converter 20 shown in FIGS. 2 and 3 this is achieved by affording the analogue input signal to the converter 24 also to the combiner 26 along the feed forward loop 28. The combiner 26 also receives the digital output signal Do from the converter 24 and hence, the quantisation error Q will appear at the output of the combiner 26. The quantisation error Q is fed along the feedback loop 30 to the combiner 22 where it is combined subtractively from the analogue input signal. The analogue input signal minus the quantisation error Q is then presented to the input of the converter 24 and the process is repeated each time the converter 24 is clocked by the clock pulses Fs.

The digital output Do from the converter 24 and the analogue input signal can be combined in this manner because the digital output signal from the converter 24, being a one step or one bit converter, is effectively an analogue voltage. For example, if the converter 24 is capable of providing an output signal having a voltage level of either 0 V or +5 V, representing, for example logical one and logical zero respectively, it can be seen that such voltage levels may be combined readily with the analogue input signal.

The operation of the A/D converter 20 can be understood more easily by means of the following example which illustrates the digital conversion, to 4 bits resolution, of an analogue input signal having an amplitude, at the time of conversion, of +4 V by an A/D converter having a one step converter giving a logical one output, represented by +15 V, when the amplitude of the input signal is greater than the threshold voltage of +7.5 V, or a logical zero output, represented by 0 V, when the amplitude of the input signal is less than +7.5 V.

When the one step converter 24 is triggered by the first clock pulse, the analogue signal amplitude at its input is +4 V which is less than +7.5 V and hence the one step converter 24 on the first clock pulse, provides a logical zero output, represented by 0 V. Therefore, the combiner 26 receives +4 V on its negative input and 0 V on its positive input. The quantisation error Q due to this conversion is −4 V as the output from the converter 24 is zero volts and not +4 V. The quantisation error Q of −4 V is fed along feedback path 30 to the negative input of the combiner 22. The analogue voltage fed to the positive input of the combiner 22 is still at +4 V as the clock rate Fs is far greater than the bandwidth of the analogue input signal $V_I$. The error Q of −4 V is inverted and combined with the analogue input of +4 V and hence the output from the combiner 22 changes to +4 V−(−4 V)=+8 V.

Hence, when the next clock pulse occurs, +8 V is present at the input of the converter 24 and also at the negative input of the combiner 26. As the input 60 to the converter 24 is greater than +7.5 V, the converter output will be a logical one, represented by +15 V; which voltage is fed to the positive input of the combiner 26. Hence, the quantisation error Q at the second clock pulse is +7 V. When inverted and combined with the input to the converter 24 (+8 V for the second clock pulse), this results in an input signal to the converter 24 for the third clock pulse of amplitude +1 V. The converter 24 will, therefore, give a logical zero output for the third clock pulse. The combiner 26 now has +1 V on its negative input and 0 V on its positive input. Hence, the quantisation error Q for the third clock pulse is −1 V which is inverted and combined with the input voltage to the converter 24 of +1 V for the third clock pulse. Therefore, for the fourth clock pulse, the input to the converter 24 is +1 V−(−1 V)=+2 V and hence, at the fourth clock pulse the converter 24 will produce an output of logical zero.

It can be seen, therefore, that the digital output signal Do from the converter 24 over the four clock periods described is 0100. When the digital output signal Do is fed through the digital filter 34 an output $N_{OUT}$ is obtained which is a digital signal sequence representing the number 4, that is, the amplitude of the analogue input signal $V_I$ at the time of the conversion.

This operation of the A/D converter 2 can be summarised as follows:

nth clock pulse

Input to one step converter = +4
Do = 0 = logical zero
Q = 0 − (+4) = −4
Input to one step converter for the next clock pulse = 4 − (−4) = +8

(n+1)th clock pulse

Input to one step converter = +8
Do = +15 = logical one
Q = +15 − (+8) = +7
Input to one step converter for the next clock pulse = 8 − (+7) = +1

(n+2)th clock pulse

Input to one step converter = +1
Do = 0 = logical zero
Q = 0 − (+1) = −1
Input to one step converter for the next clock pulse = 1 − (−1) = +2

(n+3)th clock pulse

Input to one step converter = +2
Do = 0 = logical zero
Q = 0 − (+2) = −2
Input to one step converter for the next clock pulse = +2 − (−2) = +4

It can be seen from this example that the A/D converter has established a repetitive sequence of 0100 0100 0100 for the output Do.

The performance of the one bit converter 24 shown in FIGS. 2 and 3 can be expressed as $$D_{OUT} = V_I A + Q(1 - AB)$$

where A is the gain of the input path to the converter 24 and B is the gain of the feedback loop 30.

It can be seen that when $A = B = 1$ $D_{OUT} = V_I$ that is, exact cancellation of the quantisation errors are obtained.

It can be shown mathematically that, using the arrangement shown in FIG. 3 with a digital filter having a bandwidth Fb of 10 KHz and a clock having a clock rate Fs of 10 MHz, 16 bits resolution can be achieved using, for example, LF157 operational amplifiers as sold by National Semiconductors which is superior to the resolution of known interpolating A/D converters. However, greater resolution can be obtained by using discrete amplifiers with a greater unity gain bandwidth and slew rate. Furthermore, the A/D converter of the present invention does not suffer from the problems with stability described previously with respect to known converters as the total loop gain of the converter is zero.

Although the present invention has been described with respect to a particular embodiment it is to be understood that modifications can be effected within the scope of the invention.

For example, the A/D converter may or may not include the digital filter means and the clock means for providing the clock pulses. Furthermore, although the input signal to the one bit converter 24 is afforded directly from the combiner 22, means may be provided such that the input signal to the one bit converter 24 is dependent upon the output signal from the combiner 22.

Also, in the embodiment shown in FIG. 3 the potentiometer 32 is included in the feedback loop 30 so that the signal received by the combiner 22 via the feedback loop 30 is dependent upon the quantisation error of the one bit converter 24. However, the potentiometer 32 may be omitted so that the quantisation error is afforded directly to the combiner 22.

Additionally, further means may be provided between the output of the one bit converter 24 and the input of the combiner 26, and also in the feed forward loop 28 such that the combiner 26 receiver signals which are dependent upon the input and/or output signals of the one bit converter 24.

The A/D converter according to the present invention may be fabricated as an integrated circuit, preferably using CMOs technology and such an integrated circuit may or may not include the clock means and the digital filter means.

I claim:

1. An interpolating analogue to digital converter, comprising:
   a first analogue signal combiner having first and second inputs, and an output, and being arranged to receive at said first input a continuously variable analogue input signal having a predetermined bandwidth and being arranged to receive at said second input a quantization error signal in analogue form and to provide at said output a combined version of the signals at said first and second inputs;
   a one step digital quantizer means directly coupled to said output of the first signal combiner for producing a binary valued quantized signal, and clock means connected to the quantizer means having a clock rate substantially greater than the predetermined bandwidth of the input signal;
   a second signal combiner having a first input, a second input and output, the first input being coupled to receive said quantized signal and a second input being directly coupled to said output of the first signal combiner to receive a feed forward signal therefrom whereby to provide at said output of the second signal combiner said quantization error signal; and,
   feedback means for directly coupling the quantization error signal to the second input of the first combiner;
   the arrangement being such that said quantizer means provides a serial output of pulses representing a digitized value of the input signal.

2. An interpolating converter according to claim 1 wherein the one step digital quantiser means comprises a D-type flip-flop.

3. An interpolating converter according to claim 2 wherein the feedback means for affording the signal dependent upon the quantisation error of the one step digital quantiser means to the combiner means includes trimming means for trimming the quantisation error afforded to the combiner means.

4. An interpolating converter according to claim 3 wherein the combiner means and the further combiner means comprise operational amplifiers.

5. An interpolating converter according to claim 3 further including digital filter means coupled to the output of the one step digital quantiser means.

6. An interpolating converter according to claim 5 further including clock means coupled to the one step digital quantiser means and the digital filter means for providing synchronising clock pulses to the one step digital quantiser means and the digital filter means.

* * * * *